United States Patent
Prabhakar

[19]
[11] Patent Number: 6,054,386
[45] Date of Patent: *Apr. 25, 2000

[54] PROCESS FOR FORMING SILICON-ON-INSULATOR DEVICES USING A NITRIDING AGENT

[76] Inventor: Venkatraman Prabhakar, 40640 High St., Apt. 507, Fremont, Calif. 94538

[*] Notice: This patent is subject to a terminal disclaimer.

[21] Appl. No.: 08/915,076

[22] Filed: Aug. 20, 1997

[51] Int. Cl.$^7$ .................................................. H01L 21/44
[52] U.S. Cl. ........................... 438/682; 438/149; 438/151; 438/683; 438/685; 438/655; 438/656; 438/660; 438/663; 438/664
[58] Field of Search ..................................... 438/149, 151, 438/682, 683, 685, 655, 656, 660, 663, 664

[56] References Cited

U.S. PATENT DOCUMENTS

| | | | |
|---|---|---|---|
| 5,352,631 | 10/1994 | Sitaram et al. | 437/200 |
| 5,545,574 | 8/1996 | Chen et al. | |
| 5,869,359 | 2/1999 | Prabhakar | 438/149 |

*Primary Examiner*—John F. Niebling
*Assistant Examiner*—Lynne A. Gurley
*Attorney, Agent, or Firm*—William L. Paradise, III

[57] ABSTRACT

A nitriding agent is introduced into selected regions of a semiconductor device. A metal such as, for instance, titanium is immediately deposited over the semiconductor device. A subsequent thermal annealing step induces selective reactions between the titanium and the underlying silicon, thereby resulting in the formation of a layer of titanium silicide within the selected regions, as well as a layer of titanium nitride. The layer of titanium nitride and unreacted portions of the layer of titanium are removed in a subsequent etching step, thereby leaving intact a layer of titanium silicide within the selected regions. A second annealing step converts the silicide into a substantially stoichiometric composition. The introduction of the nitriding agent into the selected regions significantly reduces the agglomeration of titanium during silicide formation, thereby resulting in a more uniform, and thus more conductive, silicide layer. In some embodiments, the introduction of the nitriding agent into the selected regions is supplemented by the formation of a layer of silicon-containing material prior to the second annealing step, while in other embodiments the introduction of the nitriding agent is replaced by the formation of the silicon-containing material prior to the second annealing.

33 Claims, 4 Drawing Sheets

PROCESS FOR FORMING SILICON-ON-INSULATOR DEVICES USING A NITRIDING AGENT

CROSS REFERENCE TO RELATED APPLICATION

This application is related to commonly owned U.S. patent application Ser. No. 08/908,022, entitled "PROCESS FOR FORMING SILICON ON INSULATOR DEVICES HAVING ELEVATED SOURCE AND DRAIN REGIONS", filed on Aug. 20, 1997, now U.S. Pat. No. 5,869,359.

BACKGROUND

1. Field of Invention

This invention relates generally to silicon-on-insulator (SOI) CMOS devices and specifically to processes for forming SOI devices having a low resistance.

2. Description of Related Art

Silicon-on-insulator (SOI) devices are those which are formed in a thin silicon layer which overlies an insulating layer. The insulating layer, in turn, overlies a second silicon layer. Fabricating integrated circuit (IC) devices in a thin silicon-on-insulator (SOI) layer, as opposed to fabricating such devices in a much thicker bulk silicon structure, allows for lower parasitic capacitance and for greater channel currents which, in turn, allows for faster speeds. The lower parasitic capacitance also allow for reduced substrate crosstalk and, thus, for reduced noise. In order to fully realize these advantages, the SOI layer within which IC devices are fabricated should be less than approximately 1000 Å so that the source and drain regions of these IC devices are proximate to the underlying insulating layer. Further, the source and drain regions of devices formed within an SOI layer should be shallow in order to minimize short channel effects.

Unfortunately, devices fabricated in a thin SOI layer and having relatively shallow source and drain regions typically exhibit an unacceptably high series resistance between the source and drain regions. This high series resistance results in slower speeds and therefore may abrogate the superior speeds sought when using SOI technologies. Accordingly, there exists a need to reduce the series resistance of such SOI devices without compromising the superior short channel effects realized by a shallow source and drain.

It is known that the series resistance of a transistor can be decreased by forming a layer of silicide within the source and drain of the transistor. The silicide material may be, for instance, Titanium Silicide ($TiSi_2$) or Cobalt Silicide ($CoSi_2$). A layer of silicide is conventionally formed by first depositing a thin film of titanium over the surface of the transistor. The transistor is then thermally annealed in a nitrogen ambient at a temperature between approximately 400–700 degrees Celsius for approximately 10–200 seconds. This thermal annealing induces reactions between the deposited titanium and the underlying silicon in, for instance, the source and drain of the transistor, to form titanium silicide ($TiSi_x$). The deposited titanium does not react with insulating materials such as, for instance, oxide or nitride layers. Thus, portions of the titanium layer overlying insulating materials in, for instance, a sidewall spacer laterally surrounding the gate of the transistor, remain in a metallic titanium state. Further, titanium proximate to a top surface of the resulting titanium silicide layer, as well as titanium proximate to a top surface of remaining portions of the deposited titanium layer, react with the ambient nitrogen to form a thin layer of titanium nitride (TiN). This layer of titanium nitride, as well as the remaining portions of the deposited titanium layer, are removed during a subsequent etching step, thereby leaving intact the titanium silicide layer within, for instance, the source and drain of the transistor. A second thermal annealing step is performed at a temperature of between 600–900 degrees Celsius for approximately between 10–200 seconds to convert the titanium silicide into a stoichiometric composition. For instance, where the titanium silicide is in the form $TiSi_2$, the second annealing converts the $TiSi_2$ from a $C_{49}$ phase to a more conductive $C_{54}$ phase. The resulting layer of titanium silicide increases the conductivity of the source and drain regions and, thus, allows for a lower series resistance.

Forming a layer of silicide in the manner described above is, however, problematic when formed within selected regions of a semiconductor device fabricated on a thin underlying layer of silicon such as, for instance, an SOI layer. Where the underlying silicon layer is less than approximately 1000 Å, the titanium undesirably agglomerates during the thermally induced reactions which form titanium silicide, thereby resulting in a non-uniform concentration of titanium in the layer of titanium silicide. In addition, undesirable voids may be formed within silicon portions underlying the titanium silicide layer. As a result, the conductivity of the resultant titanium silicide layer is undesirably reduced which, in turn, increases the series resistance of the semiconductor device. Further, non-uniformities within the resultant titanium silicide layer may degrade the performance and reliability of the target transistor. Accordingly, it would be desirable to minimize the agglomeration of titanium during formation of a titanium silicide layer within, for instance, the source and drain of a transistor formed in a thin layer of silicon.

SUMMARY

A novel method is disclosed which reduces the agglomeration of titanium during a thermally induced formation of titanium silicide within selected regions of a semiconductor device. Applicant believes that silicon films having a thickness of less than approximately 1000 Å source insufficient silicon during thermally induced reactions with titanium and, as a result, the titanium tends to agglomerate during formation of titanium silicide. Further, Applicant believes that inadvertent formation of native oxide over selected regions of a semiconductor device prior to the deposition of titanium also contributes to the undesirable agglomeration of titanium during silicide formation. In accordance with one embodiment of the present invention, a nitriding agent is introduced into, for instance, the source and drain of a transistor prior to the deposition of a silicide source metal such as, for instance, titanium thereon. The nitriding agent reacts with the underlying silicon to form a layer of nitrided silicon over a top surface of the transistor. After the deposition of a titanium layer, the transistor is thermally annealed. The titanium reacts with silicon within the underlying nitrided silicon layer, as well as with silicon within, for instance, the source and drain of the transistor, to form a layer of titanium silicide within the source and drain. The titanium also reacts with nitrogen within the underlying nitrided silicon layer to form a layer of titanium nitride. A selective wet etch is employed to remove the titanium nitride layer and unreacted portions of the deposited titanium layer, thereby leaving intact the titanium silicide layer within the source and drain of the transistor. A second thermal annealing may be performed to convert the silicide layer into a stoichiometric composition. The introduction of the nitriding agent significantly reduces the agglomeration of titanium during silicide formation, thereby resulting in a more uniform, and thus more conductive, silicide layer.

In some embodiments of the present invention, the introduction of the nitriding agent may be supplemented by the deposition of an amorphous material such as, for instance, silicon or a suitable silicon containing alloy, into those regions of a semiconductor device within which a silicide layer is desired to be formed. In such embodiments, the amorphous material is deposited into selected regions prior to the second thermal annealing step. By sourcing additional silicon during the formation of silicide, the deposition of amorphous material reduces the agglomeration of titanium during silicide formation and, as mentioned above, therefore improves the conductivity of the resultant silicide layer. In other embodiments, the introduction of the nitriding agent is entirely replaced by the deposition of an amorphous silicon-containing material.

DETAILED DESCRIPTION

The description which follows and the specific examples provided herein are illustrative for aiding in the understanding of the present invention. Accordingly, the present invention should not be construed as limited to specific examples provided below. For example, although described in the context of forming titanium silicide, present embodiments are equally applicable to the formation of other silicides such as, for instance, cobalt silicide. Further, present embodiments are described below in the context of a semiconductor device fabricated in a thin SOI layer for simplicity only; it is to be understood that present embodiments are applicable to increasing the conductivity of silicide layers formed within selected regions of a semiconductor device fabricated in any thin silicon film including, but not limited to, bulk silicon substrates.

Figure 1:
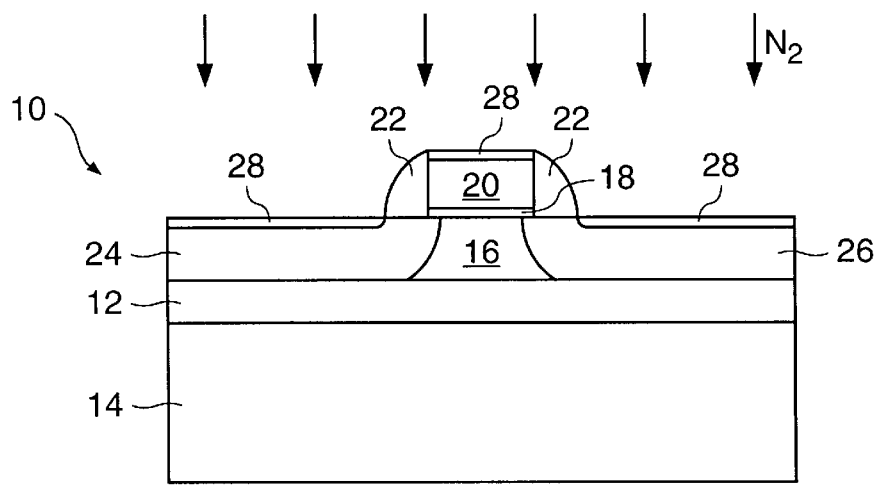
FIG. 1 is a cross-sectional view of a partially completed semiconductor device illustrating, in one embodiment of the present invention, the introduction of a nitrogen agent into exposed portions of silicon within a semiconductor device formed within a thin silicon-on-insulator layer.

Referring now to FIG. 1, an SOI structure 10 includes an insulation layer 12 formed of, for instance, $SiO_2$, and having a thickness of approximately 50–2000 Å, interposed between a silicon substrate 14 and an SOI layer 16. In the particular example illustrated in the Figures, substrate 14 is between approximately 500–2000 $\mu$m thick and SOI layer 16 is between approximately 300–2000 Å thick. After a layer of gate oxide 18 is grown to a desired thickness, a polysilicon gate 20 and sidewall spacers 22 are formed using a well known technique. Conventional doping steps are then employed to form a self-aligned shallow source 24 and drain 26 within SOI layer 16. In preferred embodiments, source 24 and drain 26 are contiguous with insulating layer 12, as shown in the Figures. However, in other embodiments, source 24 and drain 26 may not contact the insulation layer 12. In some embodiments, structure 10 is subjected to, in a pre-amorphization step, the implanting of heavy ions such as, for instance, silicon or germanium, to form amorphous regions (not shown for simplicity) within portions of gate 20, source 24, and drain 26 proximate to the top surface of structure 10.

Before deposition of a suitable metal from which a silicide layer will be subsequently formed within surface portions gate 20, source 24, and drain 26, structure 10 is exposed to a nitriding agent in order to form a nitrided layer overlying structure 10. This is in contrast to conventional silicide fabrication techniques in which the source metal is deposited without a preceding nitriding step. In some embodiments, nitrogen is sourced from a nitrogen-based plasma having, for instance, a source gas of $N_2$, $NH_3$, NO, $N_2O$, and so on. In other embodiments, nitrogen is sourced from one or more nitrogen based gases such as, for instance, $N_2$, $NH_3$, NO, $N_2O$, during rapid thermal annealing of structure 10 at a temperature of between approximately 700–1100 degrees Celsius. In yet other embodiments, nitrogen may be implanted into exposed regions of structure 10 at an angle of between approximately 0–30 degrees, an energy of between approximately 0–50 keV, and a concentration of between approximately 1E13–1E15 $cm^{-2}$.

Nitrogen provided from one of the above mentioned sources, or from any other suitable nitrogen sourcing ambient, reacts with the exposed underlying silicon of structure 10 to form a thin nitrided silicon layer 28 within surface portions of gate 20, source 24, and drain 26, as indicated in FIG. 1.

Figure 2:
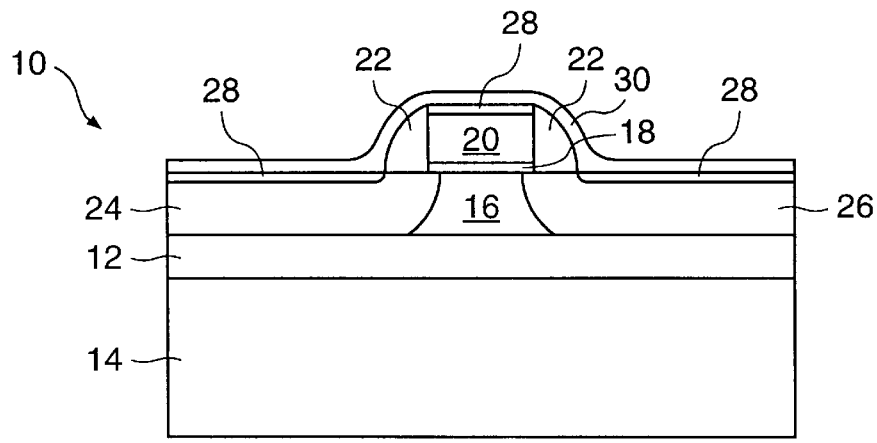
FIG. 2 is a cross-sectional view of the structure of FIG. 1 illustrating the deposition of a layer of metal over a top surface of the structure.

A layer of titanium 30 is deposited onto structure 10, as shown in FIG. 2, using suitable deposition means. Structure 10 is subjected to rapid thermal annealing at a temperature of between approximately 400–700 degrees Celsius for approximately 10–200 seconds. This annealing step, which is preferably performed in a nitrogen ambient, induces selective reaction between titanium within layer 30 and underlying silicon within structure 10, as follows.

Figure 3:
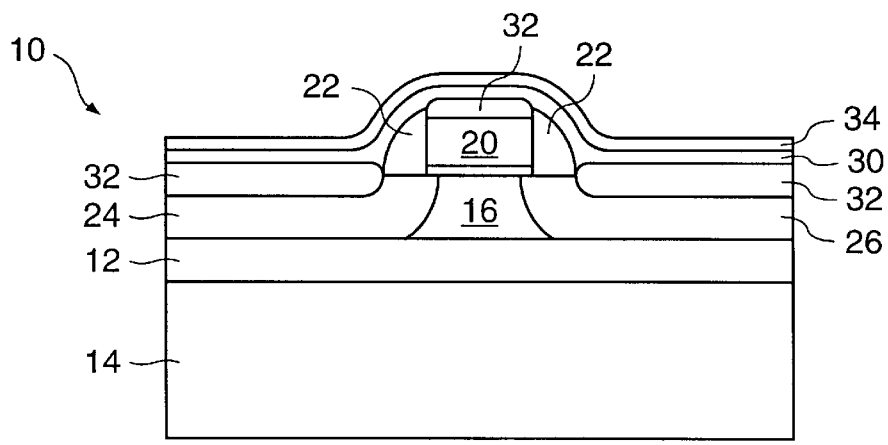
FIG. 3 is a cross-sectional view of the structure of FIG. 1 illustrating the formation of overlapping layers of metal silicide and nitrided metal induced by thermal annealing.

Referring to FIG. 3, 25 titanium within layer 30 reacts with silicon within gate 20, source 24, and drain 26, as well as with silicon within the nitrided silicon layer 28, to form a layer 32 of titanium silicide ($TiSi_x$). At this point, the titanium silicide layer 30 is titanium-rich. Since titanium does not significantly react with insulating materials such as, for instance, $SiO_2$, titanium within portions of layer 30 which overlie sidewall spacers 22 remain in a metallic state. Not all of the titanium in portions of layer 30 overlying gate 20, source 24, and drain 26 may react with underlying silicon to form titanium silicide and, as a result, a thin portion of titanium layer 30 may remain over titanium silicide layers 32, as illustrated in FIG. 3. The above-described annealing step also results in the formation of a layer 34 of titanium nitride (TiN), as illustrated in FIG. 3.

Figure 4:
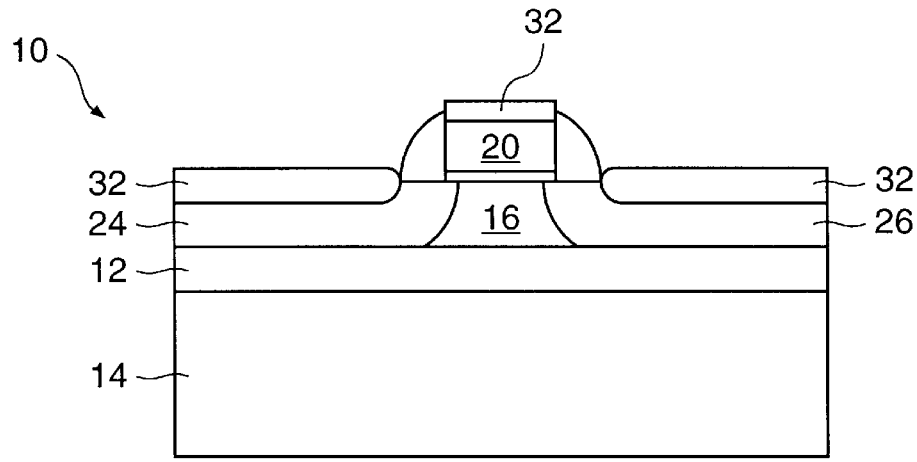
FIG. 4 is a cross-sectional view of the structure of FIG. 1 illustrating the removal of the nitrided metal layer and unreacted portions of the metal layer.

A well known selective wet etching step is performed to remove the titanium nitride layer 34 and unreacted portions of titanium layer 30, as illustrated in FIG. 4. A second thermal annealing step is performed in a nitrogen ambient at a temperature of between approximately 600–900 degrees Celsius for approximately 10–200 seconds. This second annealing step converts the titanium-rich $TiSi_x$ into a substantially stoichiometric titanium silicide. Where the titanium silicide layers 32 are of the form $TiSi_2$, the second annealing step converts the $TiSi_2$ from a $C_{49}$ phase to a more conductive $C_{54}$ phase. As mentioned earlier, the formation of a silicide layer within the source and drain of a transistor reduces the series resistance therebetween and, therefore, allows faster device speeds to be realized. However, forming silicide regions within the source and drain of a transistor in accordance with the present invention allows for even greater devices speeds, as explained below.

The nitrogen introduced into the gate 20, source 24 and drain 26 prior to the deposition of titanium layer 30 promotes more uniform reactions between titanium and silicon, and thereby reduces the agglomeration of titanium within resultant silicide layers 32 within gate 20, source 24, and drain 26. As a result, titanium silicide layers formed in accordance with the present invention exhibit a more uniform titanium concentration therein, as compared to titanium silicide layers formed using conventional methods, and therefore exhibit superior conductivity. Since superior conductivity of silicide regions formed within, for instance, the source and drain of a transistor, translates into lower series resistance between the source and drain, present embodiments allow for greater device speeds. Further, since this superior conductivity is achieved without altering the junction depth of the source and drain or the thickness of the SOI layer 16, present embodiments do not compromise other advantages characteristic of devices formed in a thin silicon film, e.g., low parasitic capacitances and superior short channel effects.

Figure 5:
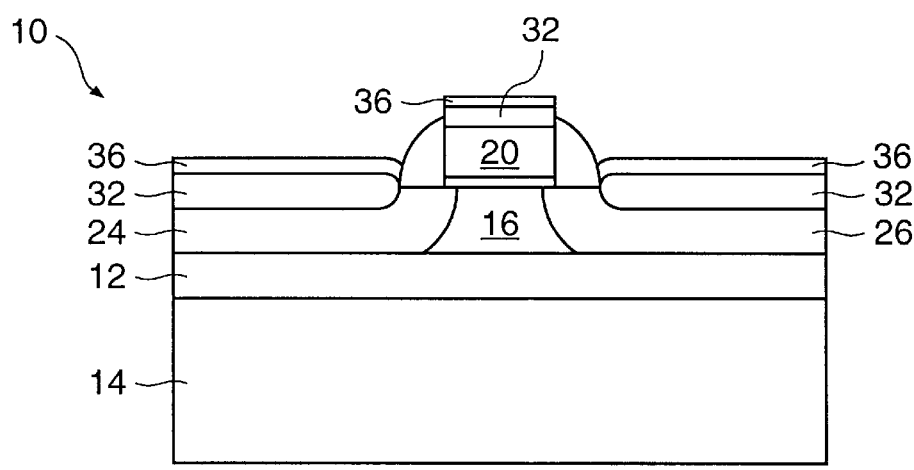
FIG. 5 is a cross-sectional view of the structure of FIG. 1 illustrating the formation of an additional nitrided layer induced by a second nitridation step in accordance with another embodiment of the present invention.

In some embodiments, the structure 10 is subjected to a second nitridation step, performed in the manner described above. Nitrogen sourced during the second nitridation step reacts with unreacted Titanium within surface portions of the titanium silicide layer 32, thereby forming a layer of titanium nitride 36 substantially overlying the silicide layer 32, as shown in FIG. 5.

As mentioned earlier, Applicant has found that the undesirable agglomeration of titanium during formation of titanium silicide may be further improved by sourcing additional silicon during thermal annealing. Thus, in other embodiments of the present invention, the undesirable agglomeration of titanium is reduced by depositing a silicon-containing material within selected regions of a semiconductor device prior to thermal annealing. These other embodiments are discussed below in the context of a structure 50, with reference to FIGS. 6–11. For convenience and simplicity, elements common to structures 10 and 50 are similarly labeled.

Figure 6:
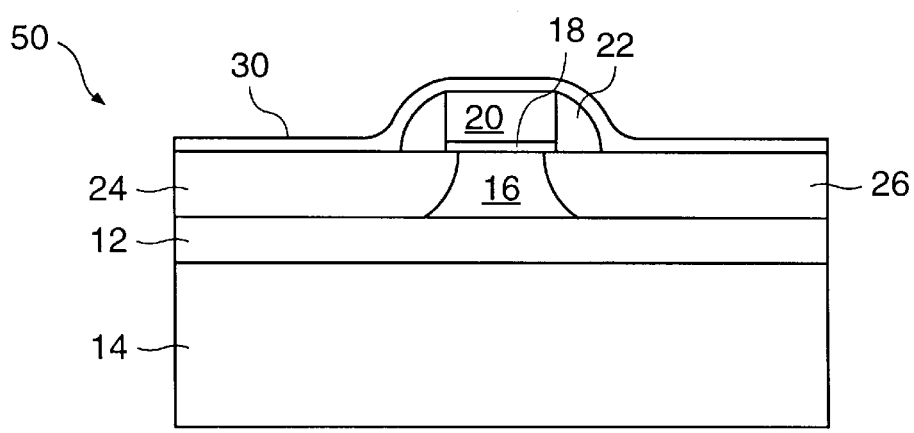
FIG. 6 is a cross-sectional view of a partially completed semiconductor device formed within a thin silicon-on-insulator film in accordance with another embodiment of the present invention.

Referring now to FIG. 6, structure 50 includes insulating layer 12 interposed between silicon substrate 14 and SOI layer 16. Oxide layer 18 insulates the polysilicon gate 20 from the underlying silicon layer 16. Sidewall spacers 22 laterally surround gate 20 and may be used to self-align the shallow source 24 and drain 26 within SOI layer 16. In some embodiments, structure 50 is subjected to, in a pre-amorphizing step, an implant of heavy ions, e.g., Si or Ge, to form amorphous regions (not shown for simplicity) within surface portions of gate 20, source 24, and drain 26. The titanium layer 30 is then deposited as described above.

Figure 7:
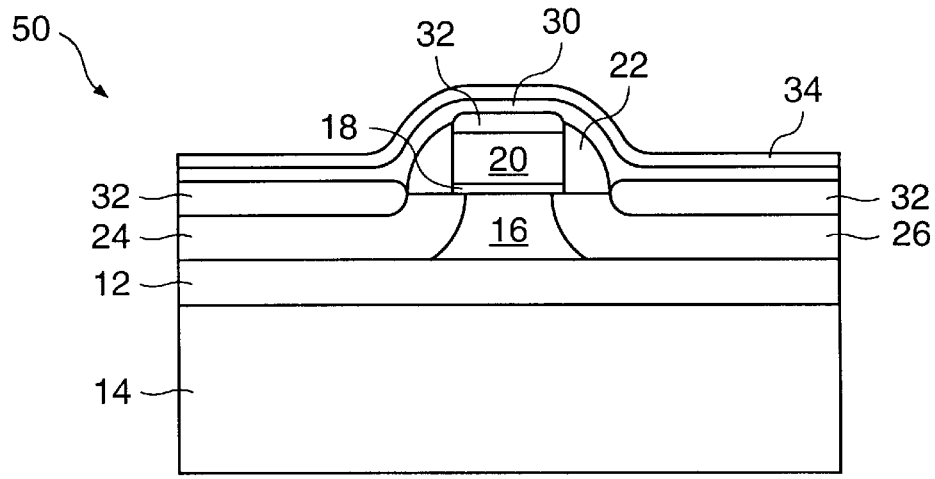
FIG. 7 is a cross-sectional view of the structure of FIG. 6 illustrating the formation of overlapping layers of silicide and nitrided metal.
Figure 8:
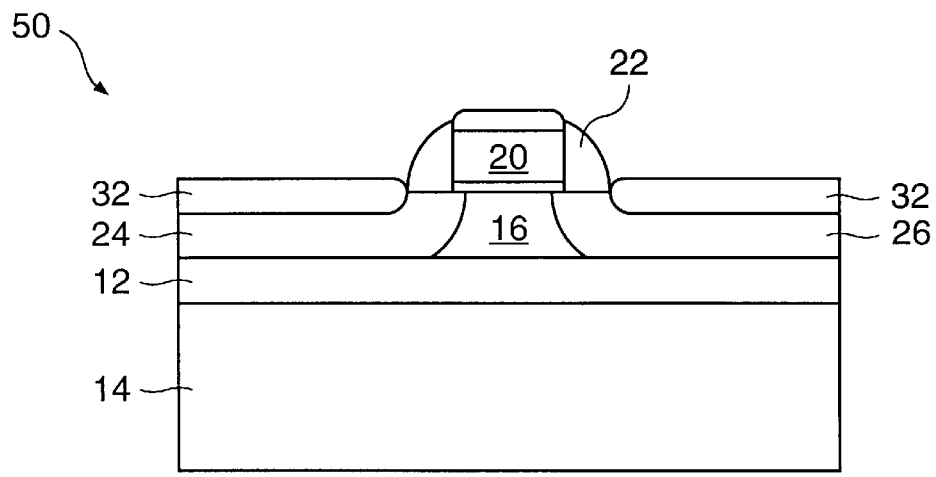
FIG. 8 is a cross-sectional view of the structure of FIG. 6 illustrating the removal of the nitrided metal and unreacted portions of the metal layer.

Structure 50 is subjected to rapid thermal annealing in a nitrogen ambient at a temperature between approximately 400–700 degrees Celsius for approximately 10–200 seconds. This annealing step induces reactions between titanium in layer 30 and silicon within gate 20, source 24, and drain 26, thereby resulting in the formation of titanium silicide layers 32 within gate 20, source 24, and drain 26, as shown in FIG. 7. Since, as mentioned earlier, titanium does not significantly react with insulating material, titanium in portions of layer 30 which overlie sidewall spacers 22 remain in a metallic state. Layer 34 of titanium nitride is also formed during this annealing step. A suitable wet etching step is employed to remove titanium nitride layer 34 and unreacted portions of titanium layer 30, as illustrated in FIG. 8.

Figure 9:
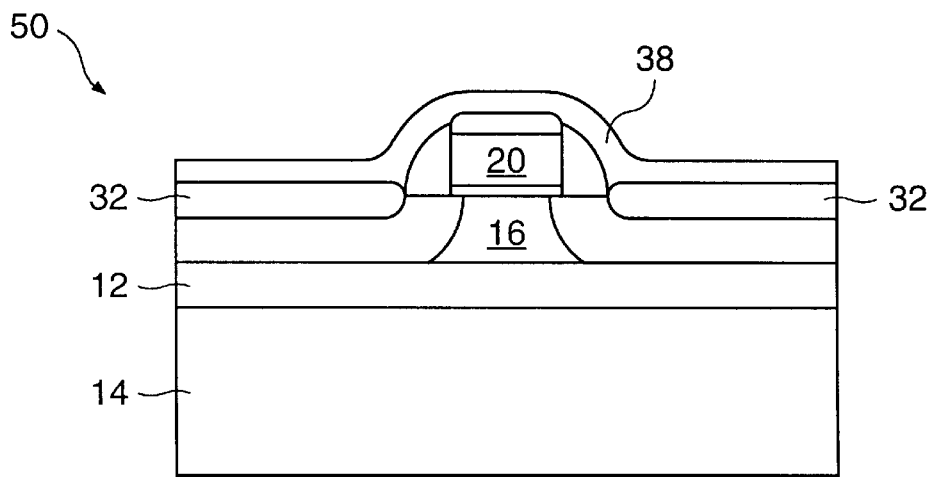
FIG. 9 is a cross-sectional view of the structure of FIG. 6 illustrating the deposition of a layer of a material suitable for sourcing silicon during subsequent annealing.

Immediately following the removal of titanium nitride layer 34 and unreacted portions of titanium layer 30, a layer of silicon-containing material such as, for instance, amorphous silicon (a-Si) 38 is formed over the top surface of structure 50, as illustrated in FIG. 9, using a suitable technique. In preferred embodiments, the resultant layer 38 is between approximately 200–2000 Å thick. In other embodiments, layer 38 may be another suitable silicon-containing material such as, for instance, polysilicon, or a suitable silicon-containing alloy such as, for instance, a silicon-germanium alloy.

Figure 10:
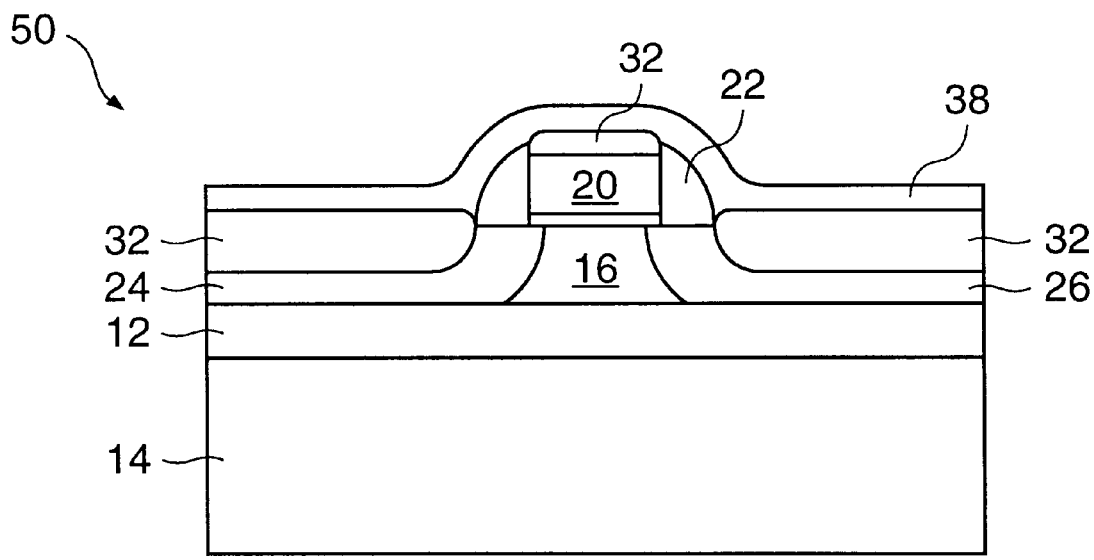
FIG. 10 is a cross-sectional view of the structure of FIG. 6 illustrating the formation of additional layers of silicide and nitrided metal, and the conversion of the silicide to a stoichiometric composition.
Figure 11:
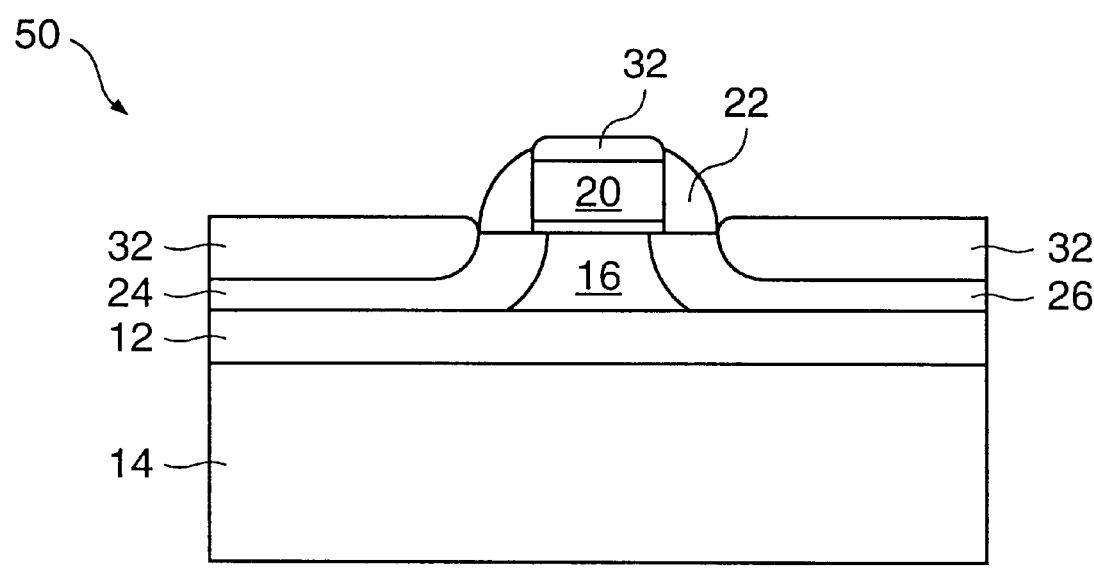
FIG. 11 is a cross-sectional view of the structure of FIG. 6 illustrating the removal of the nitrided metal layer.

Structure 50 is then subjected to a second rapid thermal annealing at a temperature of between approximately 600–900 degrees Celsius for between approximately 10–200 seconds. This annealing step, which may be performed in either a nitrogen or argon ambient, induces reactions between titanium within silicide layers 32 and silicon from within underlying gate 20, source 24, and drain 26 regions, as well as with silicon from within layer 38, thereby furthering uniform formation of titanium silicide layers 32. Accordingly, titanium silicide layers 32 within gate 20, source 24, and drain 26 are significantly thicker after this annealing step, as illustrated in FIG. 10. This annealing step also converts the titanium silicide into a substantially stoichiometric titanium silicide. Where, as mentioned above, the titanium silicide is of the form $TiSi_2$, this annealing step converts the titanium silicide layers 32 from a $C_{49}$ phase to a more conductive $C_{54}$ phase. Unreacted portions of layer 38 are then removed using a suitable etchant, as illustrated in FIG. 11.

Applicant has found that sourcing additional silicon during thermal annealing of structure 50, as described above with respect to layer 38, reduces the agglomeration of titanium during formation of titanium silicide, thereby allowing for the formation of more uniform titanium silicide regions within gate 20, source 24, and drain 26. In this manner, faster device speeds are achieved without compromising other advantages realized by forming semiconductor devices in a thin silicon film such as, for instance, SOI layer 16. Thus, present embodiments allow for superior device speeds without compromising parasitic capacitances or short channel effects. Also, present embodiments suppress the undesirable formation of voids within SOI layer 16 which, as discussed above, results from a lack of silicon during the thermally induced reactions which form silicide.

In other embodiments, where further reductions in the agglomeration of titanium during silicide formation are necessary, structure 50 may initially be subjected to a nitridation step in a manner similar to that discussed above with respect to structure 10 (see also FIG. 1).

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A method for forming silicide regions within active regions of a semiconductor device, said method comprising the steps of:
   (a) forming said active regions in a semiconductor substrate;
   (b) exposing said semiconductor device to a nitriding agent, said nitriding agent reacting with silicon within said active regions to form a layer of nitrided silicon over said active regions;
   (c) depositing a layer of metal over a top surface of said semiconductor device;
   (d) annealing said semiconductor device to induce reactions between said layer of metal and said layer of nitrided silicon to form a layer of silicide upon said active regions and a layer of nitrided metal overlying said semiconductor device; and
   (e) removing said layer of nitrided metal and unreacted portions of said layer of metal while leaving substantially intact said layer of silicide.

2. The method of claim 1, wherein said semiconductor substrate comprises a layer of silicon having a thickness of less than approximately 1000 Å.

3. The method of claim 2, wherein said semiconductor substrate further comprises a layer of silicon-on-insulator (SOI).

4. The method of claim 1, wherein step (b) comprises exposing said semiconductor device to a nitrogen-based plasma.

5. The method of claim 1, wherein step (b) comprises implanting nitrogen into said active regions at an angle of between 0–30 degrees, at an energy of between approximately 0–50 keV, and a dosage of between approximately 1E13–1E15 ions/cm$^2$.

6. The method of claim 1, wherein step (b) comprises heating said semiconductor device in a nitrogen-containing ambient to a temperature of between approximately 700–1100 degrees Celsius.

7. The method of claim 6, wherein said nitrogen-containing ambient comprises one from a group consisting of nitrogen ($N_2$), nitrogen oxide (NO), di-nitrogen oxide ($N_2O$) and ammonia ($NH_3$).

8. The method of claim 1, further comprising the step of:
   (f) exposing said semiconductor device to said nitriding agent, said nitriding agent reacting with metal from within said layer of silicide to form a second layer of nitrided metal over said layer of silicide.

9. The method of claim 1, further comprising the steps of:
   (f) depositing a layer of material containing silicon overlying said semiconductor device; and
   (g) annealing said semiconductor device to induce reactions between said layer of metal and said layer of material containing silicon to further formation of said layer of silicide.

10. The method of claim 1, further comprising the step of:
    (a1) implanting ions into said active regions.

11. The method of claim 10, where said ions are selected from the group consisting of silicon (Si) and germanium (Ge).

12. The method of claim 1, wherein said active regions comprise a source and a drain of said semiconductor device.

13. The method of claim 12, wherein said active regions further comprise a gate.

14. The method of claim 1, wherein said metal comprises titanium.

15. The method of claim 1, wherein said annealing is performed in a nitrogen ambient at a temperature of between approximately 400–700 degrees Celsius for between approximately 10–200 seconds.

16. A method for forming silicide regions within active regions of a semiconductor device, said method comprising the steps of:
    (a) forming said active regions in a semiconductor substrate;
    (b) depositing a layer of metal over a top surface of said semiconductor device;
    (c) annealing said semiconductor device to induce reactions between said layer of metal and said active regions to form a layer of silicide upon said active regions and a layer of nitrided metal overlying said semiconductor device;
    (d) removing said layer of nitrided metal and unreacted portions of said layer of metal while leaving substantially intact said layer of silicide
    (e) depositing a layer of material containing silicon overlying said semiconductor device; and
    (f) annealing said semiconductor device to induce reactions between said layer of metal and said material containing silicon to further.

17. The method of claim 16, wherein said semiconductor substrate comprises a layer of silicon having a thickness of less than approximately 1000 Å.

18. The method of claim 16, wherein said semiconductor substrate further comprises a layer of silicon-on-insulator (SOI).

19. The method of claim 16, further comprising the step of:
    (g) removing, using an etchant, unreacted portions of said layer of material containing silicon, while leaving substantially intact said layer of silicide.

20. The method of claim 16, wherein said material containing silicon comprises amorphous silicon (a-Si).

21. The method of claim 16, wherein said material containing silicon comprises polysilicon.

22. The method of claim 16, wherein said material containing silicon comprises a silicon-germanium alloy.

23. The method of claim 16, further comprising the step of:
    (a1) exposing said semiconductor device to a nitriding agent, said nitriding agent reacting with said active regions to form a layer of nitrided silicon over said active regions.

24. The method of claim 23, wherein step (a1) comprises exposing said semiconductor device to a nitrogen-based plasma.

25. The method of claim 23, wherein step (a1) comprises implanting nitrogen into said selected regions at an angle of between 0–30 degrees, at an energy of between approximately 0–50 keV, and a dosage of between approximately 1E13–1E15 ions/cm$^{-2}$.

26. The method of claim 23, wherein step (a1) comprises heating said semiconductor device in a nitrogen ambient to a temperature of between approximately 700–1100 degrees Celsius.

27. The method of claim 26, wherein said nitrogen ambient comprises one from a group consisting of nitrogen ($N_2$), nitrogen oxide (NO), di-nitrogen oxide ($N_2O$) and ammonia ($NH_3$).

28. The method of claim 16, further comprising the step of:

(a1) implanting ions into said selected regions to form amorphous regions.

29. The method of claim 28, where said ions are selected from the group consisting of silicon (Si) and germanium (Ge).

30. The method of claim 16, wherein said active regions comprise a source and a drain of said semiconductor device.

31. The method of claim 16, wherein said active regions further comprise a gate.

32. The method of claim 9, wherein said layer of metal comprises titanium.

33. The method of claim 16, wherein said annealing step (c) is performed in a nitrogen ambient at a temperature of between approximately 400–700 degrees Celcius for between approximately 10–200 seconds.

* * * * *